United States Patent [19]
Harada et al.

[11] Patent Number: 4,983,039
[45] Date of Patent: Jan. 8, 1991

[54] SPECTROMETER

[75] Inventors: Tatsuo Harada, Fuchu; Toshiei Kurosaki, Kodaira; Toshiaki Kita, Tokyo; Tsuneo Terasawa, Hachioji, all of Japan

[73] Assignee: Hitachi, Ltd., Tokyo, Japan

[21] Appl. No.: 370,034

[22] Filed: Jun. 22, 1989

[30] Foreign Application Priority Data

Jun. 24, 1988 [JP] Japan ................................ 63-154697

[51] Int. Cl.⁵ .............................................. G01J 3/18
[52] U.S. Cl. ...................................... 356/328; 355/53; 372/32; 372/57
[58] Field of Search ............... 356/305, 306, 307, 320, 356/326, 328, 329, 331, 332, 334; 372/32, 57; 355/53

[56] References Cited

U.S. PATENT DOCUMENTS

| | | | |
|---|---|---|---|
| 3,171,882 | 3/1965 | Baird | 356/306 |
| 3,229,566 | 1/1966 | Hutchinson et al. | 356/329 |
| 3,522,739 | 8/1970 | Coor et al. | 356/320 |
| 3,846,024 | 11/1974 | Turner | 356/329 |
| 4,191,473 | 3/1980 | Hansch | 356/328 |
| 4,823,354 | 4/1989 | Znotins et al. | 372/57 |
| 4,829,533 | 5/1989 | Hallberg et al. | 372/32 |

FOREIGN PATENT DOCUMENTS 7905871 2/1981 Netherlands ..................... 356/320

OTHER PUBLICATIONS

Fredrikson, *The Review of Scientific Instruments*, vol. 44, No. 1, Jan. 1973, pp. 52-55.
Optical Technology Handbook, 1980, pp. 1066-1067.

*Primary Examiner*—F. L. Evans
*Attorney, Agent, or Firm*—Fay, Sharpe, Beall, Fagan, Minnich & McKee

[57] ABSTRACT

A spectrometer is disclosed, in which plural entrance slits are mounted, and a reference light passing through one entrance slit and the light to be measured passing through the other entrance slit are simultaneously focused on a photo-sensitive surface of a detector through a diffraction grating and a focusing optical system, to measure the wavelength of the light to be measured precisely by using the reference light as a standard.

32 Claims, 6 Drawing Sheets

SPECTROMETER

BACKGROUND OF THE INVENTION

The present invention relates to a spectrometer for measuring the wavelength of a radiation emitted from a light source which can produce a line spectrum within a limited wavelength range, and more particularly to a spectrometer suited to measure the wavelength of a radiation which is emitted from an excimer laser, with high resolving power and high precision.

An excimer laser is used as a high brightness light source for generating ultraviolet radiation which is used to form the image of ultra fine patterns on a semiconductor substrate, thereby forming a semiconductor integrated circuit. In general, the image of fine patterns having a minimum dimension less than half a micron is formed on the semiconductor substrate by a stepper including a projection lens with high resolving power. Since for ultraviolet radiations are used as the exposure light of the stepper, the material for forming the projection lens is limited to those capable of transmitting ultraviolet radiations, such as quartz. Accordingly, in order to prevent the chromatic aberration due to the projection lens, it is necessary to make the wavelength of the exposure light coincide with the design conditions of the projection lens, and moreover it is required to make the spectral width of the exposure light very narrow. Hence, it is necessary to precisely control the wavelength of a radiation emitted from an excimer laser which is used as the light source of a stepper, and means for measuring the emission spectrum of the excimer laser very precisely is indispensable for such precise wavelength control.

The wavelength of a radiation emitted from a light source which produces a line spectrum, has hitherto been measured by a spectrometer provided with a diffraction grating. In many cases, the above wavelength has been measured by a Czerny-Turner monochrometer, which is described, for example, on pages 1066 and 1067 of a Japanese textbook entitled "Kogaku Gijutsu Handbook (Optical technology Handbook)" and published in 1980.

FIG. 10 shows the optical system of the Czerny-Turner monochrometer. Referring to FIG. 10, a light beam passing through an entrance slit 1 is converted by a concave mirror 2 into parallel rays, which are reflected and diffracted from a plane diffraction grating 4. A light component which is included in the diffracted light and has a specified wavelength, is reflected from another concave mirror 3 and focused on an exit slit 42 by the concave mirror 3, to pass through the exit slit 42. The wavelength of the light component which passes through the exit slit 42 is dependent upon the groove spacing of the grating 4 and the angle of rotation thereof. When the intensity of light passing through the exit slit 42 is measured while rotating the grating 4, the emission spectrum of a light source is obtained, as shown in FIG. 11.

Now, let us suppose that the groove spacing of the grating 4 is 1/3600 mm, and the focal length of the concave mirrors 2 and 3 is 1 m. In this case, the spectral dispersion on the exit slit is, approximately 4 mm/nm for a wavelength in the vicinity of the wavelength 248.4 nm of the laser beam emitted from a KrF excimer laser. Accordingly, it is basically possible to measure the absolute wavelength and spectral width of the radiation which is used as the exposure light of a stepper, with a precision of the order of 0.001 nm.

In a case where an excimer laser is used as the light source of a stepper, it is required to make constant the frequency of the excimer laser, or to make constant the wavelength of the emitted laser radiation in a predetermined medium, that is, in vacuum. In a case where the wavelength of a laser beam is measured in air by a spectrometer provided with a diffraction grating, however, the refractive index of air varies with temperature and atmospheric pressure, and hence the measured wavelength of the laser beam also varies with temperature and atmospheric pressure. Accordingly, in a case where the wavelength of a laser beam is measured in air, the simultaneous measurement of the wavelength of the laser beam and the wavelength of a reference light beam having a constant frequency, by means of the same spectrometer is required, to calibrate the spectrometer and to correct the influence of variation in refractive index of air on the measured wavelength of the laser radiation.

The wavelength of the radiation emitted from a light source which produces a line spectrum, and the fluctuation of the wavelength with time can be measured by a photoelectric detector with high spatial resolution, for example, a linear image sensor or the like. In this case, when the spectral image that is focused by a concave mirror or the like is enlarged by a lens system and the enlarged spectral image is focused on the photo-sensitive surface of the detector, the wavelength of the radiation can be measured, with very high precision. In a case where the difference in wavelength between the radiation to be measured and the reference light is so small that both spectral images can be simultaneously focused on the photo-sensitive surface of a detector, the reference light can be used as the standard for the wavelength of the radiation to be measured. In general, it is difficult to find reference light whose wavelength is nearly equal to the wavelength of the radiation to be measured. For example, a line spectrum which is emitted from a mercury lamp and has a wavelength of 253.7 nm, is suited to be used as the reference light for a radiation which is emitted from KrF excimer laser with a wavelength of 248.4 nm. However, in the above-mentioned spectrometer having a spectral dispersion of about 4 mm/nm, these spectral lines are focused on the focal plane in a state that the spectral lines are, spaced apart from each other with a distance of about 20 mm. When the focused spectral images are enlarged by a lens system and the enlarged spectral images focused on a detector plane, it is impossible to detect these spectral images simultaneously by the detector with limited sensitive area.

In the above example, it is possible to rotate the diffraction grating so that the radiation to be measured and the reference light are alternately received by the same detector. In this case, however, it is impossible to detect both spectra at the same time. Furthermore, an error in the mechanical rotation of the grating will to reduce the accuracy in measurement of wavelength. That is, the prior art has a drawback that it is impossible to measure the wavelength of a desired one of spectral lines existing within a wide wavelength range, with high resolving power, and accuracy.

SUMMARY OF THE INVENTION

An object of the present invention is to provide a spectrometer which can measure the wavelength of a radiation emitted from a light source for producing a line spectrum in a limited wavelength range, by comparing the wavelength of a reference spectral line having a constant frequency, without necessitating mechanical scanning, and can solve a problem that a conventional spectrometer cannot measure the wavelength of a desired one of spectral lines existing within a wide wavelength range, with high resolving power.

In order to attain the above object, according to the present invention, there is provided a spectrometer having a diffraction grating, in which spectrometer first and second entrance slits are spaced apart from each other a distance calculated from the dispersion of the diffraction grating, and the light to be measured passing through the first entrance slit and reference light passing through the second entrance slit are both reflected and diffracted from the diffraction grating so that a predetermined spectral line of the light to be measured and a predetermined spectral line of the reference light are focused on a single detector, to measure the wavelength of the spectral line of the light to be measured by using the spectral line of the reference light as a standard, without necessitating mechanical scanning.

When the groove spacing of the diffraction grating of a spectrometer, the spectral wavelength of light incident on the diffraction grating, the spectral order (that is, the order of diffraction of diffracted light), the angle of incidence at the diffraction grating, and the angle of diffraction are expressed by $\sigma$, $\lambda$, m, $\alpha$, and $\beta$, respectively, we can obtain the following equation:
$m\lambda = \sigma(\sin \alpha + \sin \beta)$ Now, let us consider a case where it is known that the wavelength of the light to be measured is nearly equal to $\lambda_M$ and the reference light has a wavelength $\lambda_S$. When the angle of incidence of the light to be measured and the angle of incidence of the reference light are adjusted so that the light to be measured and reference light have substantially the same angle of diffraction, by using the above equation, both lights can be focused on the same detector. For example, let us consider a case where a radiation emitted from a mercury lamp and having a wavelength of 253.7 nm is used as reference light for precisely measuring the wavelength of a radiation which is emitted from a KrF excimer laser that has a wavelength of approximately 248.4 nm. A Czerny-Turner spectrometer provided with a diffraction grating having a groove spacing of 1/3,600 mm is used for wavelength measurement, the angle of diffraction of diffracted light of the first order is 20°, the angle of incidence $\alpha_S$ of the reference light is 34.841°, and the angle of incidence $\alpha_M$ of the light to be measured is 33.519°. Now, let us suppose that the focal length of the incident optical system of the spectrometer is 1 m. When the first and second entrance slits are formed in a slit member so as to be spaced apart from each other with a distance of 23.07 mm, and the spectrometer is adjusted so that the reference light passing through the first entrance slit has the angle of incidence of 34.841° and the angle of diffraction of 20°, the light to be measured passing through the second entrance slit has the angle of incidence of 33.519° and thus can be focused on a focal plane in close proximity to the reference light. When spectral images of the reference light and the light to be measured are enlarged by a lens system, and the enlarged spectral images are focused on a photoelectric detector having high spatial resolving power, the wavelength of the light to be measured and the fluctuation of this wavelength with time can be measured very precisely, by comparing the reference light beam as a standard.

DESCRIPTION OF THE PREFERRED EMBODIMENTS

Various embodiments of the present invention will be explained below, with reference to the drawings.

Figure 1:
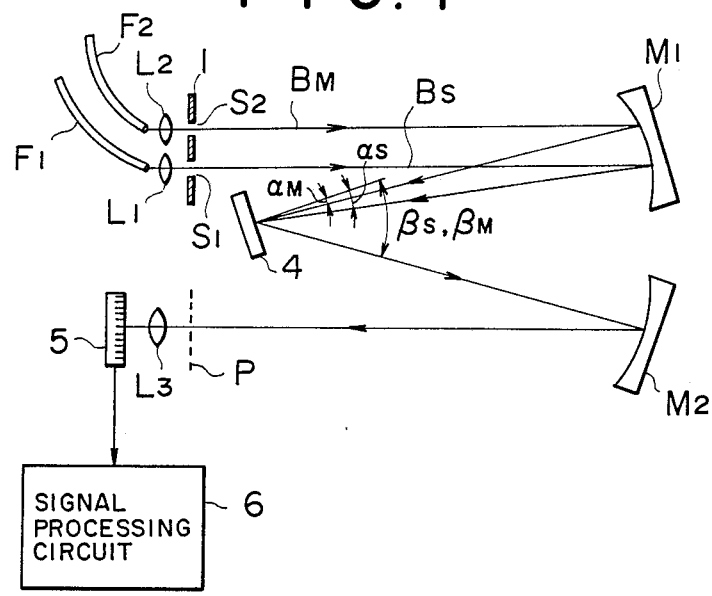
FIG. 1 is a schematic diagram showing the principle and an embodiment of a spectrometer according to the present invention.
Figure 2:
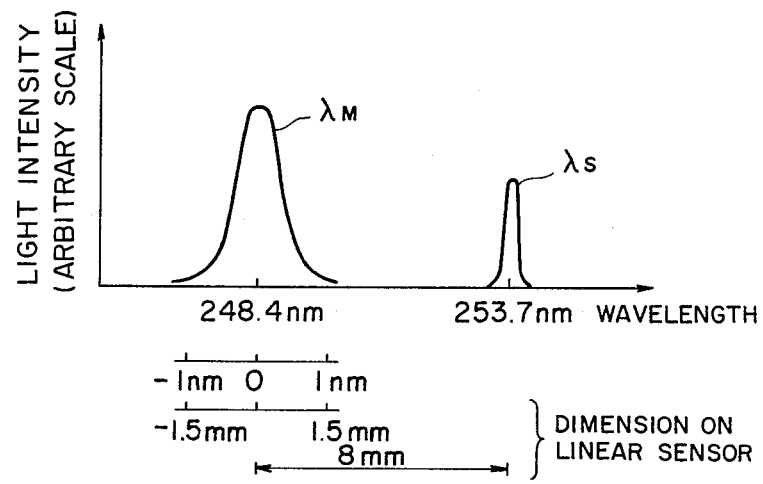
FIG. 2 is a graph showing a spectrum detected by the embodiment of FIG. 1.

FIG. 1 shows an embodiment of a spectrometer according to the present invention which embodiment uses the Czerny-Turner optical arrangement. Referring to FIG. 1, reference light $B_s$ guided by an optical fiber $F_1$ passes through a lens $L_1$ and a first entrance slit $S_1$, and is then converted by a collimation mirror $M_1$ into parallel light beams, incident on a diffraction grating 4, to be reflected and diffracted therefrom. A specified wavelength component of the diffracted reference light is reflected from a focusing mirror $M_2$ and then focused on a focal plane P. Light to be measured $B_M$ guided by another optical fiber $F_2$ passes through a lens $L_2$ and a second entrance slit $S_2$, and is then converted by the collimation mirror $M_1$ into parallel light beams, incident on the grating 4, to be reflected and diffracted therefrom. The diffracted light to be measured is focused on the focal plane P by the focusing mirror $M_2$. When the angle of incidence of the reference light for the grating and the angle of incidence of the light to be measured for the grating are appropriately selected, the difference between the angle of diffraction of the reference light and the angle of diffraction of the light to be measured can be made very small. For example, let us consider a case where the groove spacing of the grating 4 is 1/3,600 mm, the angle of incidence $\alpha_S$ of the reference light is 24.4°, and the angle of incidence $a_M$ of the light to be measured is 23.222°. When a spectral line emitted from a mercury lamp and having a wavelength of 253.7 nm is used as the reference light, the angle of diffraction $\beta_S$ of the reference light is 30.0143°. Further, when a spectral line emitted from a KrF excimer laser and having a wavelength of approximately 248.4 nm is, the angle of diffraction $\beta_M$ of the laser light is used as the light to be measured 29.9964. When the focal length of the focusing mirror $M_2$ is 1 m, the reference spectral line and the spectral line to be measured are focused on the focal plane P in a state that these spectral lines are spaced apart from each other with a distance of 0.312 mm. When the focal length of the collimation mirror $M_2$ is 1 m, the first entrance slit $S_1$ and the second entrance slit $S_2$ are spaced apart from each other with a distance of 20.56 mm. Two spectral images focused on the focal plane P are enlarged by a magnifying lens $L_3$, and then detected by means of a linear image sensor 5 and a signal processing circuit 6. Thus, a line spectrum shown in FIG. 2 is obtained. Now, let us suppose that the magnification of the lens $L_3$ is 25. Then, the reference spectral line having a wavelength $\lambda_S$ of 253.7 nm and the spectral line to be measured having a wavelength $\lambda_M$ of 248.4 nm are focused on the image sensor 5 at different positions, which are spaced apart from each other with a distance of about 8 mm. A change in wavelength of the laser light can be measured by measuring the above-mentioned positions of the laser spectral line on the basis of the reference spectral line on the image sensor 5. In this case, the spectral dispersion on the photoelectric conversion surface of the image sensor 5 is 104 μm, per 0.001 nm wavelength difference. When photoelectric conversion elements are arranged on the image sensor 5 at intervals of 25 μm, a wavelength difference of 0.001 nm can be detected a difference of four elements.

Figure 3:
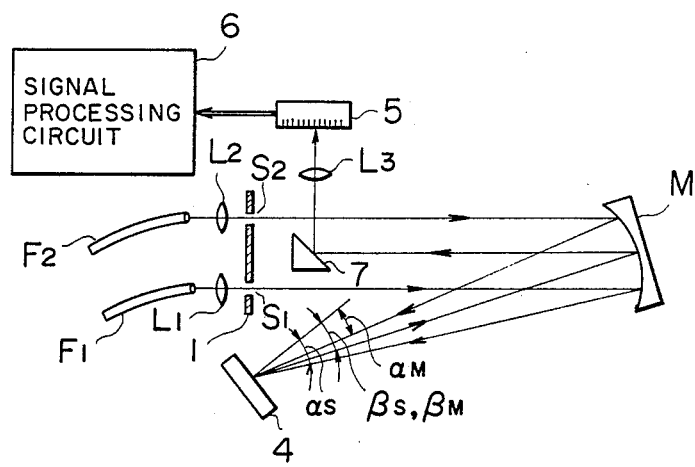
FIG. 3 is a schematic diagram showing another embodiment of a spectrometer according to the present invention.

FIG. 3 shows another embodiment of a spectrometer according to the present invention, in which embodiment the Littrow mounting is used. Referring to FIG. 3, a concave mirror M performs the functions of the collimator mirror $M_1$ and the focusing mirror $M_2$ which are used in ther embodiment of FIG. 1. Further, the diffracted beams from the grating 4 are reflected from a reflecting mirror 7 so as to be directed to the image sensor 5.

Now, let us consider a case where the groove spacing of the grating 4 is 1/3,600 mm, the angle of incidence $a_S$ of the reference light is 27.48° and the angle of incidence $a_M$ of the light to be measured is 26.26°. Then, the angle of diffraction $\beta_S$ of the reference spectral line having a wavelength of 253.7 nm is 26.8644°, and the angle of diffraction $\beta_M$ of the spectral line to be measured having a wavelength of approximately 248.4 nm is 26.8589°. When the concave mirror M has a focal length of 1 m, the beams of reference and to be measured diffracted from the grating 4 are focused on a focal plane in a state that these spectral lines are spaced apart from each other with a distance of 0.096 mm. When the spectral images of the reference and to be measured beams focused on the focal plane are magnified on the linear image sensor 5 by the lens $L_3$ of 25 magnifications, the reference line and spectral line to be measured on the image sensor 5 are spaced apart from each other with a distance of 2.4 mm. Thus, the dispersion of the light on the image sensor 5 is 101 μm per 0.001 nm wavelength difference.

In a case where a spherical mirror is used as the concave mirror 5, and the spherical mirror is mounted so that divergent beams passing through the entrance slit $S_1$ and $S_2$ are incident on the spherical mirror with off-axis conditions, the light beams reflected from the spherical mirror are not collimated beams in a strict sense. When such approximately collimated beams are reflected and diffracted by a plane diffraction grating having a constant groove spacing, and then focused by the same spherical mirror, the focused beams will have aberrations mainly of the coma-typed. For example, in a case where a spherical mirror having a radius of curvature of 2 m is used as the concave mirror M, a spectral line having a wavelength of 250 nm is incident on the spherical mirror at a position of 100 mm, off-axis at the center, and the diffraction grating has a constant groove spacing with a width of 100 mm, the maximum value of coma-type aberration will be about 150 μm.

In order to eliminate the above aberration, according to the present embodiment, the groove spacing of the grating 4 is varied. Now, let us express the groove spacing and angle of incidence at the center of the grating 4 by $a_0$ and $a_0$, respectively, and express the angle of incidence at a position which is spaced apart, in a direction perpendicular to each groove, from the center of the grating 4 a distance x, by $a(x)$. When the diffraction grating 4 has a groove spacing $\sigma(x)$ given by the following equation:

$$\sigma(x) = \sigma_0 \left( 1 - \frac{a(x) - a_0}{\tan \sigma(x)} \right) \quad (1)$$

the aberration of the spectral line due to the spherical mirror will be eliminated. For example, when a minimum groove spacing is made smaller than the groove spacing at the center of the grating by $1.5 \times 10^{-2}$ per cent the above-mentioned coma-type aberration having a maximum value equal to 150 μm can be eliminated.

Figure 4:
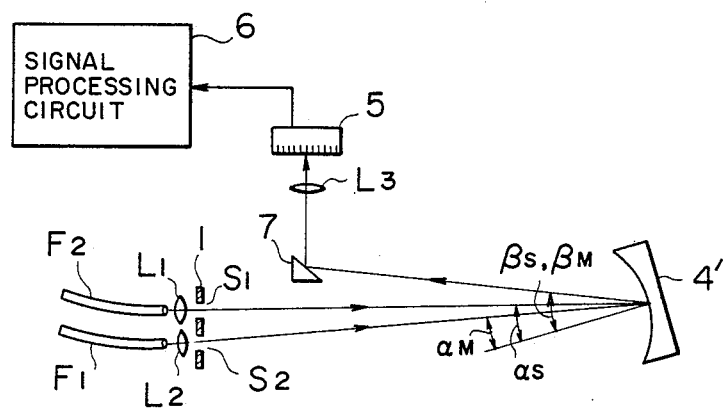
FIG. 4 is a schematic diagram showing a further embodiment of a spectrometer according to the present invention which embodiment uses a concave diffraction grating.

FIG. 4 shows a further embodiment of a spectrometer according to the present invention which embodiment uses a concave diffraction grating. Referring to FIG. 4, a concave diffraction grating 4' has both the light dispersing function of a grating and the light focusing function of a concave mirror. Hence, the present embodiment can eliminate a collimation mirror and a focusing mirror, that is, the present embodiment can be formed of a simple optical system.

In the present embodiment, the concave grating 4' has a radius of curvature of 1 m, and has, for example, a groove spacing of 1/3,600 mm. Referring again to FIG. 4, a reference light guided by the optical fiber $F_1$ passes through the first entrance slit $S_1$ and then is incident on the concave grating 4'. Light to be measured guided by the optical fiber $F_2$ passes through the second entrance slit $S_2$ and then is incident on the concave grating 4'. Both beams diffracted from the concave grating 4' are focused on the linear image sensor 5 through the reflecting mirror 7 and the magnifying lens $L_3$. Thus, the wavelength of the light to be measured can be precisely measured by using the reference spectral line as a standard.

In a case where the concave grating 4' has equally-spaced and, straight grooves, it is required that the first and second entrance slits and positions where the reference and measured spectral lines are focused, are all placed on a Rowland circle, a circle which is tangent to the grating at the center and where the diameter coincides to the radius of carvature of the grating surface. In this case, when the reference light and the light to be measured diffracted from the concave grating 4' are spaced apart from each other, these spectral lines are defocused on the linear image sensor 5, and thus it will be very difficult to measure the wavelength of the measured spectral line precisely. Further, when a light beam incident on the concave grating 4' diverges in the lengthwise direction of a groove, the focal curve of the light beam is a straight line deviating from the Rowland circle, and thus the spectral images focused on the image sensor has astigmatism.

The above difficulties can be eliminated by making the groove spacing non-uniform. A groove spacing $\sigma(x)$ dependent upon the position x of the groove can be expressed by the following equation:

$$\sigma(x) = \sigma_0 \left( 1 + \frac{2b_2}{R} x + \frac{3b_3}{R^2} x^2 + \frac{4b_4}{R^3} x^3 + \ldots \right) \quad (2)$$

where R indicates the radius of curvature of the concave grating. When the parameter $b_2$ in the equation (2) is appropriately selected, the spectral images are focused not on the Rowland circle but on a lemniscate. In this case, when a light source and the position where spectral images are focused are arranged on the same curve, the horizontal focal curve on which spectral images are sharpest along wavelength dispersion direction $F_H$ is indicated by the following relation between a distance r from the center of the concave grating and a diffraction angle $\beta$:

$$r = \frac{\cos^2\beta}{\cos\beta - 2b_2\sin\beta} \cdot R \quad (3)$$

Now, let us suppose that the parameter $b_2$ is 0.168. Further, let us consider a case where the angle of incidence $\alpha_S$ of the reference light is 26.34°, the reference light source is spaced apart from the center of the grating with a distance of 1075.88 mm, the angle of incidence $\alpha_M$ of the light to be measured is 25.12°, and the light source is spaced apart from the center of the grating with a distance of 1074.730 mm. The reference light emitted from a mercury lamp and having a wavelength of 253.7 nm will have an angle of diffraction $\beta_S$ of 28.0098°, and will be focused on a point which is spaced apart from the center of the grating with a distance of 1075.000 mm. The light to be measured having a wavelength of approximately 248.4 nm will have an angle of diffraction $\beta_M$ of 28.0164°, and will be focused on a point which is spaced apart from the center of the grating a distance of 1075.000 mm. The focal plane of these spectral lines is perpendicular to the diffracted beams. The linear dispersion on the focal plane is 4.383 mm/nm.

In a case where the focal plane of spectral images is perpendicular to the diffracted beams, high-resolution images of the spectral lines can be formed on the image sensor by using a magnifying lens. When the spectral images are magnified and focused on the image sensor by a lens of 25 magnifications, the linear dispersion on the image sensor will be 109.6 μm per 0.001 nm wavelength difference.

In the above case, when the grooves of the grating are straight and parallel to one another, vertical focal curve *$F_V$ which does not generate astigmatism, will not coincide with the horizontal focal curve $F_H$. Hence, the spectral line focused on the lemniscate has astigmatism, but is far smaller in astigmatism than the spectral images focused on the Rowland circle by using a grating with equally-spaced grooves.

Figure 5:
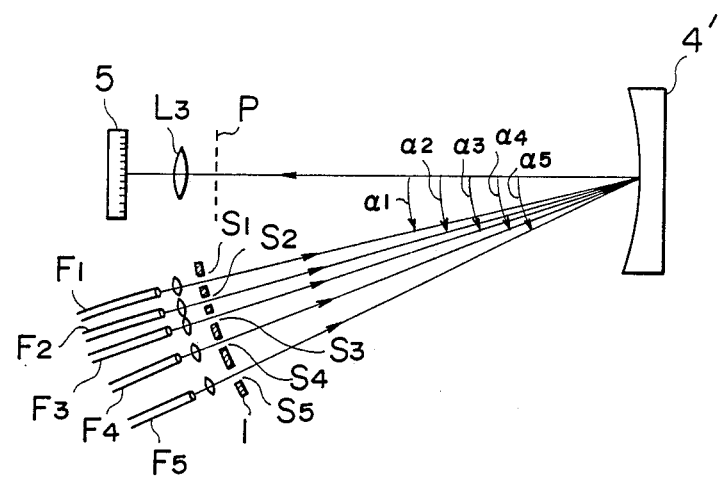
FIG. 5 is a schematic diagram showing still another embodiment of a spectrometer according to the present invention which embodiment can measure the wavelengths of light beams emitted from a plurality of light sources having different wavelengths.

FIG. 5 shows still another embodiment of a spectrometer according to the present invention which embodiment can measure respective wavelengths of predetermined beams emitted from a plurality of light sources. The term "light sources" indicates semiconductor lasers and others. Referring to FIG. 5, the concave grating 4' has a radius of curvature of 500 mm, and the groove spacing at the center of the grating 4' is 1/300 mm. Further, entrance slits $S_1$ to $S_5$ are arranged so that the angles of incidence $\alpha_1$ to $\alpha_5$ of beams passing through the entrance slits $S_1$ to $S_5$ are 10.94°, 13.53°, 14.42°, 22.95°, and 27.52°, respectively. A reference light emitted from a He-Ne laser and having a wavelength of 632.8 nm passes through the entrance slit $S_1$ and is then diffracted from the concave grating 4'. At this time, the angle of diffraction of the reference spectral line is 0°. Further, a light to be measured having a wavelength of approximately 780 nm, a light to be measured having a wavelength of approximately 830 nm, a light to be measured having a wavelength of approximately 1,300 nm, and light to be measured having a wavelength of approximately 1,540 nm pass through the entrance slits $S_2$, $S_3$, $S_4$, and $S_5$, respectively, and are then diffracted from the grating. The angle of diffraction of each measured spectral line is approximately 0°. In this case, the linear dispersion on the focal plane P of the spectral images is 0.15 mm/nm. When the spectral images on the focal plane P are magnified four times and then focused on the linear image sensor 5 by means of the lens $L_3$, the dispersion on the image sensor 5 is 0.6 mm/nm. When photoelectric conversion elements are arranged on the surface of the image sensor 5 at intervals of 25 μm, the image sensor 5 will have a wavelength resolving power of 0.04 nm/element, that is, one element will correspond to a wavelength difference of 0.04 nm. According to the present embodiment, the spectral line emitted from a semiconductor laser whose approximate frequency is known, is guided to an appropriate entrance slit $S_2$, $S_3$, $S_4$, or $S_5$, and the wavelength of the above laser light can be precisely measured by using the reference light which is emitted from the He-Ne laser and passes through the entrance slit $S_1$, as a standard.

Figure 6:
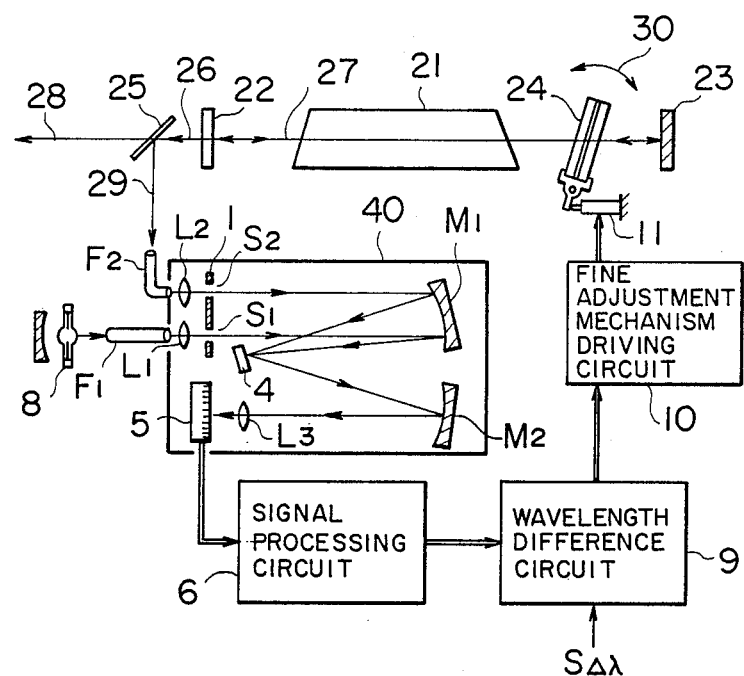
FIG. 6 is a schematic diagram showing an embodiment of an excimer laser apparatus according to the present invention.
Figure 7:
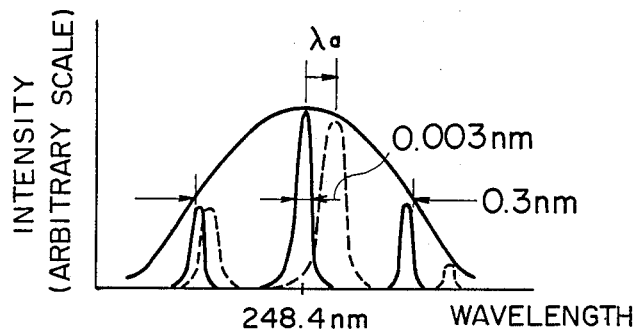
FIG. 7 is a graph for explaining the behavior of a spectral line emitted from the excimer laser apparatus of FIG. 6.

FIG. 6 shows an embodiment of an excimer laser apparatus according to the present invention, in which embodiment the wavelength of a laser beam emitted from an excimer laser can be stabilized. Referring to FIG. 6, light rays generated in an excimer laser oscillator 21 travels between reflecting mirrors 22 and 23, and then pass through the mirror 22 to form a laser beam 28. The wavelength of the laser beam emitted from an excimer laser usually spreads in a range from 0.3 to 0.5 nm. By placing an etalon 24 on the optical path of the excimer laser as shown in FIG. 6, the wavelength range (that is, band width) of the laser beam can be reduced to the order of 0.001 nm as shown in FIG. 7. When a KrF gas is used in an excimer laser provided with an etalon, an ultraviolet laser radiation having a wavelength of 248.4 nm and a band width of 0.003 nm can be obtained. However, when the position of the etalon is varied with a change in ambient temperature or vibration, the center wavelength of the spectral line of the laser beam deviates from an original center wavelength by an amount $\lambda_d$ as shown in FIG. 7, or the spectral line may have a wide band width. In order to solve the above problem, the present embodiment includes an excimer laser, a spectrometer 40 for precisely measuring the wavelength of the laser beam emitted from the excimer laser, by utilizing reference light, a signal processing circuit 6 for processing the output signal of the spectrometer, and a fine adjustment mechanism 11 for moving the etalon 24 slightly on the basis of the output of the signal processing circuit so that the wavelength of the laser radiation is kept constant. In more detail, in the signal processing circuit 6, the measured laser radiation and the reference light are detected and separated from each other, and then the wavelength of the measured laser beam is determined. A signal proportional to the difference between the wavelength of the measured laser beam and that of the reference light beam is produced in a wavelength difference circuit 9, and the deviation of the above signal from a signal $S_{\Delta\lambda}$ proportional to a predetermined difference (that is, correct difference) between the wavelength of the measured laser beam and that of the reference light beam, is sent from the wavelength difference circuit 9 form of an electric signal. The driving circuit 10 controls, for example, a pulse motor, which is included in the fine adjustment mechanism 11. In the present embodiment, as shown in FIG. 6, the laser beam 26 emitted from the excimer laser is divided by a beam splitter 25 into two beams 28 and 29. The laser beam 29 which is far weaker in intensity than the laser beam 28, is guided to the second entrance slit $S_2$ through the optical fiber $F_2$. While, a reference light beam which is emitted from a mercury lamp 8 and has a wavelength of 253.7 nm, is guided to the first entrance slit $S_1$ through the optical fiber $F_1$. The specifications of the spectroscope 40 are as follows. The first and second entrance slits $S_1$ and $S_2$ are spaced apart from each other a distance of 20.56 mm, the focal length of each of the concave mirrors $M_1$ and $M_2$ is equal to 1 m, the groove spacing of the plane grating 4 is equal to 1/3,600 mm, the lens $L_3$ of 25 manifications is used for enlarging two spectral lines which are taken out of the measured laser beam and the reference light beam, and photoelectric conversion elements are arranged on the linear image sensor 5 at intervals of 25 $\mu$m. The spectrometer 40 having the above specifications can measure the wavelength of the laser beam emitted from the excimer laser, with a precision of 0.001 nm, by using the reference light beam as a standard. The wavelength of the laser beam is determined by the signal processing circuit 6, and the wavelength thus determined is sent to the wavelength difference circuit 9, to be compared with a predetermined value. The etalon 24 is sightly rotated in accordance with the difference between the detected wavelength of the laser beam and the predetermined value, to make the wavelength of the laser beam constant. Thus, even when the environment of the excimer laser is varied, the wavelength of the laser beam emitted from the excimer laser is kept constant.

Figure 8:
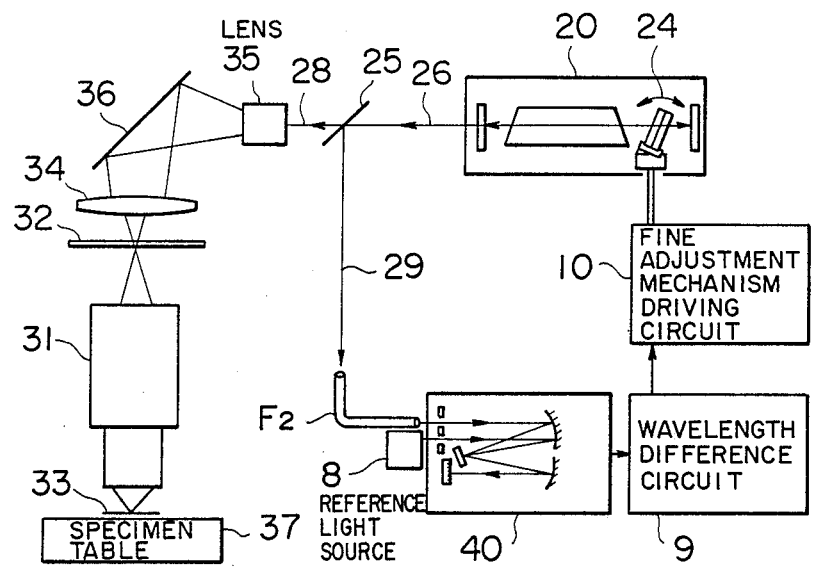
FIG. 8 is a schematic diagram showing an embodiment of an excimer laser stepper according to the present invention.
Figure 9:
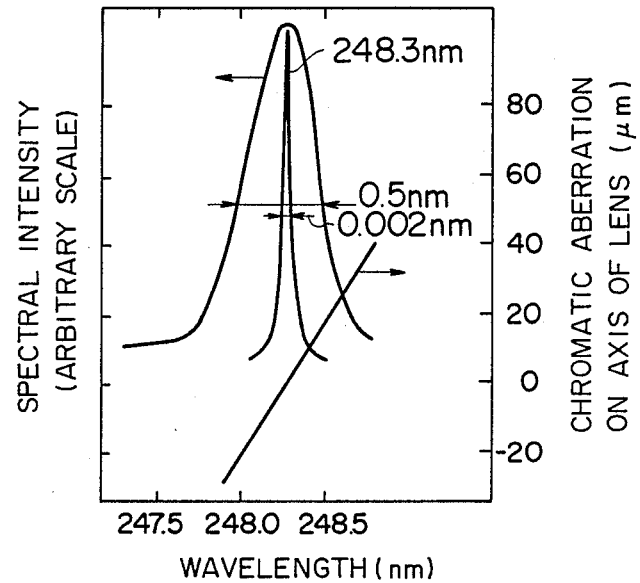
FIG. 9 is a graph showing the performance of the projection lens which is used in the excimer laser stepper of FIG. 8.
Figure 10:
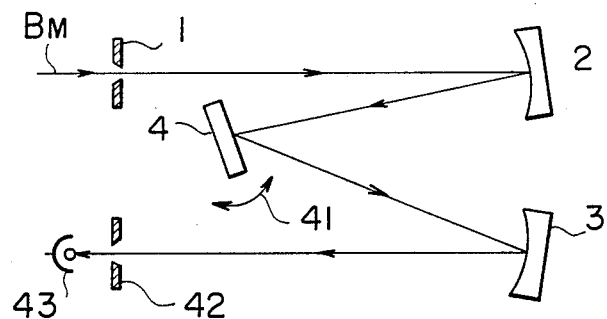
FIG. 10 is a schematic diagram showing the optical system of a Czerny-Turner spectrometer.
Figure 11:
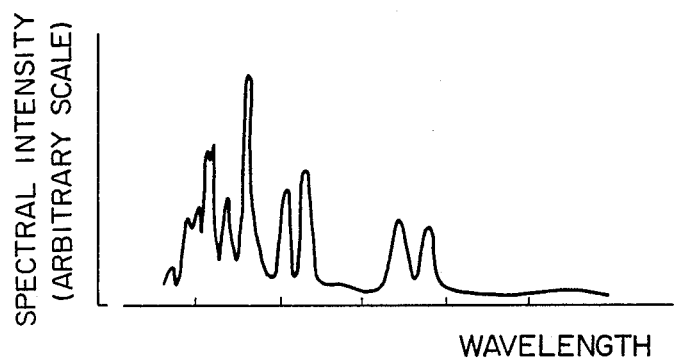
FIG. 11 is a graph showing a spectrum obtained by the spectrometer of FIG. 10.

FIG. 8 shows an embodiment of a stepper according to the present invention which embodiment uses an excimer laser as a light source. Referring to FIG. 8, exposure light 28 from the beam splitter 25 passes through a magnifying lens 35 and is then reflected from a plane mirror 36, incident on an article 32, on which a mask pattern of a semiconductor device is drawn. A reduced image of the mask pattern or an image of the mask pattern equal in size thereto is projected, by a projection lens 31, on a semiconductor wafer 33 which is placed on a wafer table 37. As is well known, the resolving power of the projection lens 31 is determined from the numerical aperture of the lens and the wavelength of light used. That is, the resolving power increases as the numerical number is larger and the wavelength of light, is shorter. An excimer laser can be used as a high-brightness source for generating far ultraviolet rays. When a KrF gas is used in the excimer laser, the laser emits a radiation having a wavelength of 248.4 nm. An optical material which is used for forming a lens and can transmit far ultraviolet rays, is limited to quartz, from the practical point of view. Accordingly, it is necessary to make the lens only of quartz. In order to prevent the chromatic aberration due to the lens made of single material, it is necessary to make the line width of a radiation passing through the lens less than 0.005 nm as shown in FIG. 9.

Referring back to FIG. 8, the laser beam 26 emitted from an excimer laser 20 is divided by the beam splitter 25 into two beams 28 and 29. As mentioned above, the beam 28 is used as the exposure light. While, the beam 29 is guided to the spectrometer 40 through an optical fiber $F_2$. In the spectrometer 40, the wavelength of the beam 29 is measured by using a spectral line which is emitted from the mercury lamp 8 and has the wavelength of 253.7 nm, as a standard. The result of measurement is sent to the wavelength difference circuit 9, to be compared with a predetermined wavelength, that is, the design wavelength of the projection lens 31. When the measured wavelength differs from the predetermined one, the etalon 24 included in the excimer laser 20 is rotated on the basis of the output of the wavelength difference circuit 9 so that the measured wavelength becomes equal to the predetermined one. Thus, the wavelength of the exposure light 28 is always made equal to the design wavelength of the projection lens 31, and thus the images of a fine pattern can be formed on the wafer 33 very precisely.

While a preferred embodiment has been set forth along with modifications and variations to show specific advantageous details of the present invention, further embodiments, modifications and variations are contemplated within the broader aspects of the present invention, all as set forth by the spirit and scope of the following claims.

We claim:

1. A spectrometer, comprising:
    a first entrance slit for passing a reference light beam therethrough;
    a second entrance slit for passing a light beam to be measured therethrough;
    a combination of a diffraction grating and a focusing optical system for reflecting and diffracting at least a spectral line of both the reference light beam passing the first entrance slit and the light beam to be measured passing through the second entrance slit, to focus the spectral lines of the reflected and diffracted reference light beam and the reflected and diffracted light beam to be measured; and
    linear image detection means for measuring the wavelength of the focused spectral line light beam to be measured by using the wavelength of the focused spectral line of the reference light beam as a standard.

2. A spectrometer according to claim 1, wherein the detection means has a detection surface receiving the spectral lines of the reference light beam and the light beam to be measured at spaced apart locations, and the detection means measures the wavelength of the light to be measured as a difference from the wavelength of the reference light as a standard in response to the spacing between the spaced apart locations.

3. A spectrometer according to claim 1, wherein the combination of a diffraction grating and a focusing optical system is made up of a plane diffraction grating and a pair of concave mirrors, wherein both the reference light beam passing through the first entrance slit and the light beam to be measured passing through the second entrance slit are collimated by one of the concave mirrors and then are incident on the plane diffraction grating, and wherein both the diffracted reference spectral image and the diffracted spectral image to be measured are simultaneously focused on the detection means by the other concave mirror.

4. A spectrometer according to claim 1, wherein the combination of a diffraction grating and a focusing optical system is made up of a plane diffraction grating and a concave mirror, and wherein the reference light beam passing through the first entrance slit and the light beam to be measured passing through the second entrance slit are collimated by the concave mirror, and both the diffracted reference spectral image and the diffracted spectral image to be measured are simultaneously focused by the concave mirror.

5. A spectrometer according to claim 1, wherein the combination of a diffraction grating and a focusing optical system is formed of a concave diffraction grating.

6. A spectrometer according to claim 1, wherein the detection means includes a photoelectric sensor array having position resolving power.

7. A spectrometer according to claim 1, wherein a spectral line included in the line spectrum of a mercury lamp is used as the diffracted reference spectral line.

8. A spectrometer according to claim 1, wherein a spectral line emitted from a laser and having a known wavelength is used as the diffracted reference spectral line.

9. A spectrometer according to claim 1, wherein said linear image detection means has a light detecting area, and the spectrometer being so constructed, including the distance between said entrance slits, so that the focused light beam to be measured and the focused reference light beam can be focused on a common detecting area of said linear image detection means simultaneously.

10. A spectrometer according to claim 2, wherein the combination of a diffraction grating and a focusing optical system including means for enlarging the spectral lines to increase the distance between said locations and thereby improve the accuracy of detection.

11. A spectrometer according to claim 10, wherein the combination of a diffraction grating and a focusing optical system simultaneously directs the spectral lines of the reference light beam and the beam to be measured simultaneously on the detection surface and the detection means measures these locations at the same time.

12. A spectrometer according to claim 2, wherein the combination of a diffraction grating and a focusing optical system simultaneously directs the spectral lines of the reference light beam and the beam to be measured simultaneously on the detection surface and the detection means measures these locations at the same time.

13. An excimer laser apparatus comprising:
an excimer laser;
a spectrometer having a structure according to claim 1, for precisely measuring the wavelength of a radiation emitted from the excimer laser; and
means for controlling the excimer laser on the basis of the measured wavelength of the radiation so that the wavelength of the radiation is always kept at a predetermined value.

14. The apparatus according to claim 13, wherein the detection means has a detection surface receiving the spectral lines of the reference light beam and the light beam to be measured at spaced apart locations, and the detection means measures the wavelength of the light to be measured as a difference from the wavelength of the reference light as a standard in response to the spacing between the spaced apart locations.

15. The apparatus according to claim 14, wherein the combinations of a diffraction grating and a focusing optical system including means for enlarging the spectral lines to increase the distance between said locations and thereby improve the accuracy of detection.

16. The apparatus according to claim 18, wherein the combination of a diffraction grating and a focusing optical system simultaneously directs the spectral lines of the reference light beam and the beam to be measured simultaneously on the detection surface and the detection means measures these locations at the same time.

17. A stepper comprising:
a light source;
a spectrometer having a structure according to claim 1, for precisely measuring the wavelength of light emitted from the light source;
means for controlling the light source on the basis of the measured wavelength of the light so that the measured wavelength of the light is always kept at a predetermined value; and
a projector for forming an image of a mask pattern on a semiconductor substrate, light emitted from the light source and having a wavelength kept at the predetermined value being used as the exposure light of the projector.

18. A stepper according to claim 17, wherein the combination of a diffraction grating and a focusing optical system including means for enlarging the spectral lines to increase the distance between said locations and thereby improve the accuracy of detection.

19. A stepper according to claim 17, wherein an excimer laser is used as the light source.

20. A stepper according to claim 18, wherein an excimer laser is used as the light source.

21. An excimer laser apparatus comprising:
an excimer laser;
a spectrometer for precisely measuring the wavelength of a radiation emitted from the excimer laser, and having
a first entrance slit for passing a reference light beam therethrough,
a second entrance slit for passing a light beam to be measured therethrough,
a combination of a diffraction grating and a focusing optical system for reflecting and diffracting at least a spectral line of both the reference light beam passing through the first entrance slit and the light beam to be measured passing through the second entrance slit, to focus the spectral lines of the reflected and diffracted reference light beam and the reflected and diffracted light beam to be measured, and detection means for detecting the focused spectral line light beam to be measured and the focused reference light beam; and means for controlling the excimer laser on the basis of the measured wavelength of the radiation so that the wavelength of the radiation is always kept at a predetermined value.

22. A stepper comprising:

a light source;

a spectrometer for precisely measuring the wavelength of light emitted from the light source, and having a first entrance slit for passing a reference light beam therethrough, a second entrance slit for passing a light beam to be measured therethrough, a combination of a diffraction grating and a focusing optical system for reflecting and diffracting at least a spectral line of both the reference light beam passing through the first entrance slit and the light beam to be measured passing through the second entrance slit, to focus the spectral lines of the reflected and diffracted reference light beam and the reflected and diffracted light beam to be measured, and detection means for detecting the focused spectral line light beam to be measured and the focused reference light beam;

means for controlling the light source on the basis of the measured wavelength of the light so that the measured wavelength of the light is always kept at a predetermined value; and a projector for forming an image of a mask pattern on a semiconductor substrate, light emitted from the light source and having a wavelength kept at the predetermined value being used as the exposure light of the projector.

23. A stepper according to claim 22, wherein an excimer laser is used as the light source.

24. A spectrometer, comprising:

means for passing a light beam to be measured along a first path;

means for passing a reference light beam of a different wavelength from the wavelength of the light beam to be measured along a second path in spaced relationship to the first path; optical means for focusing and diffracting at least respective spectral lines of the reference light beam and light beam to be measured simultaneously with a common diffraction grating and at least one common focusing optical element and to project the spectral images of the spectral lines simultaneously;

detection means having a single detection surface;

means for enlarging the projected spectral lines simultaneously and forming an enlarged spectral image of the spectral lines respectively spaced apart from each other on the single detection surface at the same time; and said detection means measuring the spaced apart distance between the spectral lines of the spectral image on the surface and producing a correlated difference signal corresponding to the difference in wavelength between the reference light beam and the light beam to be measured.

25. An apparatus including the spectrometer according to claim 24, further comprising:

feedback means for adjusting the wavelength of the light beam to be measured by feedback responsive to the difference signal.

26. The apparatus according to claim 25, further including a laser for producing the beam to be measured.

27. The apparatus according to claim 26, further including a projector for forming an image of a mask pattern on a semiconductor substrate with at least a portion of the light beam to be measured.

28. The apparatus according to claim 26, wherein said laser is an excimer laser.

29. An apparatus for producing a stabilized light source, comprising:

first light source for passing a reference light beam of a known stable wavelength;

a second light source, separate from said first light source, for passing a light beam to be measured and controlled to stabilize its wavelength at a wavelength different from the wavelength of the reference light beam;

a combination of a diffraction grating and a focusing optical system for reflecting and diffracting at least a spectral line of both the reference light beam and the light beam to be measured, with a diffraction grating common to both the reference light beam and the light beam to be measured;

means establishing separate paths for the reference light beam and the light beam to be measured from their respective sources to the combination of a diffraction grating and a focusing optical system to thereby determine the angle of incidence of the light beam to be measured and the angle of incidence of the reference light beam to the diffraction grating in correlation to the difference in their wavelength so that the spectral lines of the reference light beam and the light beam to be measured have substantially the same angle of diffraction; and detector means for simultaneously receiving the spectral lines of the reference light beam and the light beam to be measured from the diffraction grating on a common surface and producing an output signal difference correlated to the difference in wavelength between the reference light beam and the light beam to be measured in response to the spacing between the spectral lines on the surface; and feedback means for controlling the wavelength of the light beam to be measured to stabilize the same in response to the difference signal.

30. The apparatus according to claim 29, further including an excimer laser for producing the beam to be measured.

31. The apparatus according to claim 29, further including a projector for forming an image of a mask pattern on a semiconductor substrate with at least a portion of the light beam to be measured.

32. The apparatus according to claim 31, further including an excimer laser for producing the beam to be measured.

* * * * *